US009644262B2

(12) United States Patent
Hanson et al.

(10) Patent No.: US 9,644,262 B2
(45) Date of Patent: May 9, 2017

(54) SELF-CENTERING PROCESS SHIELD

(71) Applicant: Applied Materials, Inc., Santa Clara, CA (US)

(72) Inventors: Ryan Hanson, Cupertino, CA (US); Goichi Yoshidome, Albany, CA (US); Nelson Yee, Redwood City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 383 days.

(21) Appl. No.: 14/198,569

(22) Filed: Mar. 5, 2014

(65) Prior Publication Data

US 2014/0261175 A1   Sep. 18, 2014

Related U.S. Application Data

(60) Provisional application No. 61/792,626, filed on Mar. 15, 2013.

(51) Int. Cl.
C23C 14/34 (2006.01)
C23C 14/56 (2006.01)
H01J 37/32 (2006.01)
H01J 37/34 (2006.01)

(52) U.S. Cl.
CPC ...... *C23C 14/564* (2013.01); *H01J 37/32623* (2013.01); *H01J 37/32651* (2013.01); *H01J 37/34* (2013.01); *H01J 37/3447* (2013.01); *Y10T 428/13* (2015.01); *Y10T 428/131* (2015.01)

(58) Field of Classification Search
CPC combination set(s) only.
See application file for complete search history.

(56) References Cited

U.S. PATENT DOCUMENTS 5,484,486 A * 1/1996 Blackburn ........ H01J 37/32642
                                                            118/715
5,985,102 A    11/1999 Leiphart
7,097,744 B2    8/2006 Liu et al.
(Continued)

FOREIGN PATENT DOCUMENTS

JP    10-195645 A    7/1998
JP    2005-264177 A    9/2005

OTHER PUBLICATIONS

International Search Report and Written Opinion mailed Jun. 25, 2014 for PCT Application No. PCT/US2014/021655.

*Primary Examiner* — Jason M Berman
(74) *Attorney, Agent, or Firm* — Moser Taboada; Alan Taboada

(57) ABSTRACT

A process shield may include an elongated annular body having an outer surface and an inner surface; a lip extending radially outward from the outer surface of the body proximate a first end of the body such that a first portion of the body extends beyond the lip toward the first end; a plurality of openings in the lip; and a pin disposed in each of the plurality of openings to align the target assembly atop the process shield when the lid is placed atop the process shield, wherein the pin comprises an elongated body having a first surface with a beveled peripheral edge, wherein the first surface has a first diameter, a second surface opposing the first surface, wherein the second surface has a second diameter, and a sidewall, between the first surface and the second surface, wherein the sidewall has a concave portion having a third diameter.

18 Claims, 5 Drawing Sheets

(56) References Cited

U.S. PATENT DOCUMENTS

2004/0251130 A1\* 12/2004 Liu .................... H01J 37/3441
 204/298.01
2005/0199491 A1\* 9/2005 Gung ................... C23C 14/046
 204/298.11

\* cited by examiner

SELF-CENTERING PROCESS SHIELD

CROSS-REFERENCE TO RELATED APPLICATIONS

This application claims benefit of U.S. provisional patent application Ser. No. 61/792,626, filed Mar. 15, 2013, which is herein incorporated by reference in its entirety.

FIELD

Embodiments of the present invention generally relate to physical vapor deposition processing equipment.

BACKGROUND

In current physical vapor deposition (PVD) chambers, a process shield is typically mounted to the main body of the PVD chamber, separately from the target. The target is typically mounted on a removable lid of the PVD chamber and then lowered onto the chamber body for processing. However, the inventors have discovered that such a configuration may undesirably result in the process shield and the target being inaccurately aligned. The inventors have discovered that as the frequency of radio frequency (RF) energy applied to the target increases, the alignment between the target and shield becomes more critical to controlling any plasma irregularity and arc events, which may negatively affect the quality of deposition in the PVD chamber. Current PVD chambers utilize features that are separate from the target and the process shield to align the two components. However, the inventors have observed that such features fail to adequately align the target and process shield.

Accordingly, the inventors have provided improved apparatus for PVD processing.

SUMMARY

Methods and apparatus for physical vapor deposition are provided. In some embodiments, a process shield, for use in a substrate processing chamber having a chamber lid comprising a target coupled thereto, includes an elongated annular body having an outer surface and an inner surface defining a central opening of the body; a lip extending radially outward from the outer surface of the body proximate a first end of the body such that a first portion of the body extends beyond the lip toward the first end; a plurality of openings in the lip; and a pin disposed in each of the plurality of openings to align the target atop the process shield when the lid is placed atop the process shield, wherein the pin comprises an elongated body having a first surface with a beveled peripheral edge, wherein the first surface has a first diameter, a second surface opposing the first surface, wherein the second surface has a second diameter, and a sidewall, between the first surface and the second surface, wherein the sidewall has a concave portion having a third diameter.

In some embodiments, a process shield for use in a substrate processing chamber having a chamber lid comprising a target coupled to the chamber lid is provided herein. The process shield includes an elongated annular body having an outer surface and an inner surface defining a central opening of the body; a lip extending radially outward from the outer surface of the body proximate a first end of the body such that a first portion of the body extends beyond the lip toward the first end; three openings in the lip; and a pin disposed in each of the three openings to align the target atop the process shield when the lid is placed atop the process shield, wherein each pin comprises: an elongated body having a first surface with a first diameter and a beveled peripheral edge; a second surface opposing the first surface and having a second diameter; and a sidewall disposed between the first surface and the second surface, wherein the sidewall has a concave portion having a third diameter; wherein the three pins engage the target to align an outer edge of the target a first distance from an inner surface of the body.

In some embodiments, a substrate processing chamber includes a chamber body; a chamber lid disposed atop the chamber body, wherein the chamber lid comprises an axis of rotation configured to rotate the chamber lid onto the chamber body; a target assembly disposed within the chamber lid, wherein the target assembly comprises a target material coupled to a backing plate; and a process shield disposed within the chamber body and below the target assembly, the process shield comprising an elongated annular body having an outer surface and an inner surface defining a central opening of the body; a lip extending radially outward from the outer surface of the body proximate a first end of the body such that a first portion of the body extends beyond the lip toward the first end; a plurality of openings in the lip; and a pin disposed in each of the plurality of openings to align the target assembly atop the process shield when the lid is placed atop the process shield, wherein the pin comprises an elongated body having a first surface with a beveled peripheral edge, wherein the first surface has a first diameter, a second surface opposing the first surface, wherein the second surface has a second diameter, and a sidewall, between the first surface and the second surface, wherein the sidewall has a concave portion having a third diameter.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical

DETAILED DESCRIPTION

Methods and apparatus for improved physical vapor deposition processing equipment are provided herein. The present invention provides improved process shield designs that may be utilized with a range of very high frequency RF frequencies and/or source materials for sputter deposition in a PVD chamber or in other plasma enhanced substrate processing systems. Embodiments of the process shields of the present invention may advantageously reduce or prevent arcing between the target material and the process shield and improve wafer deposition symmetry by providing improved alignment between the process shield and the target material. As used herein, the term align or alignment refers to the concentric placement of the outer edge of the target material a first distance from an inner surface of the process shield body proximate an end of the process shield.

Figure 1:
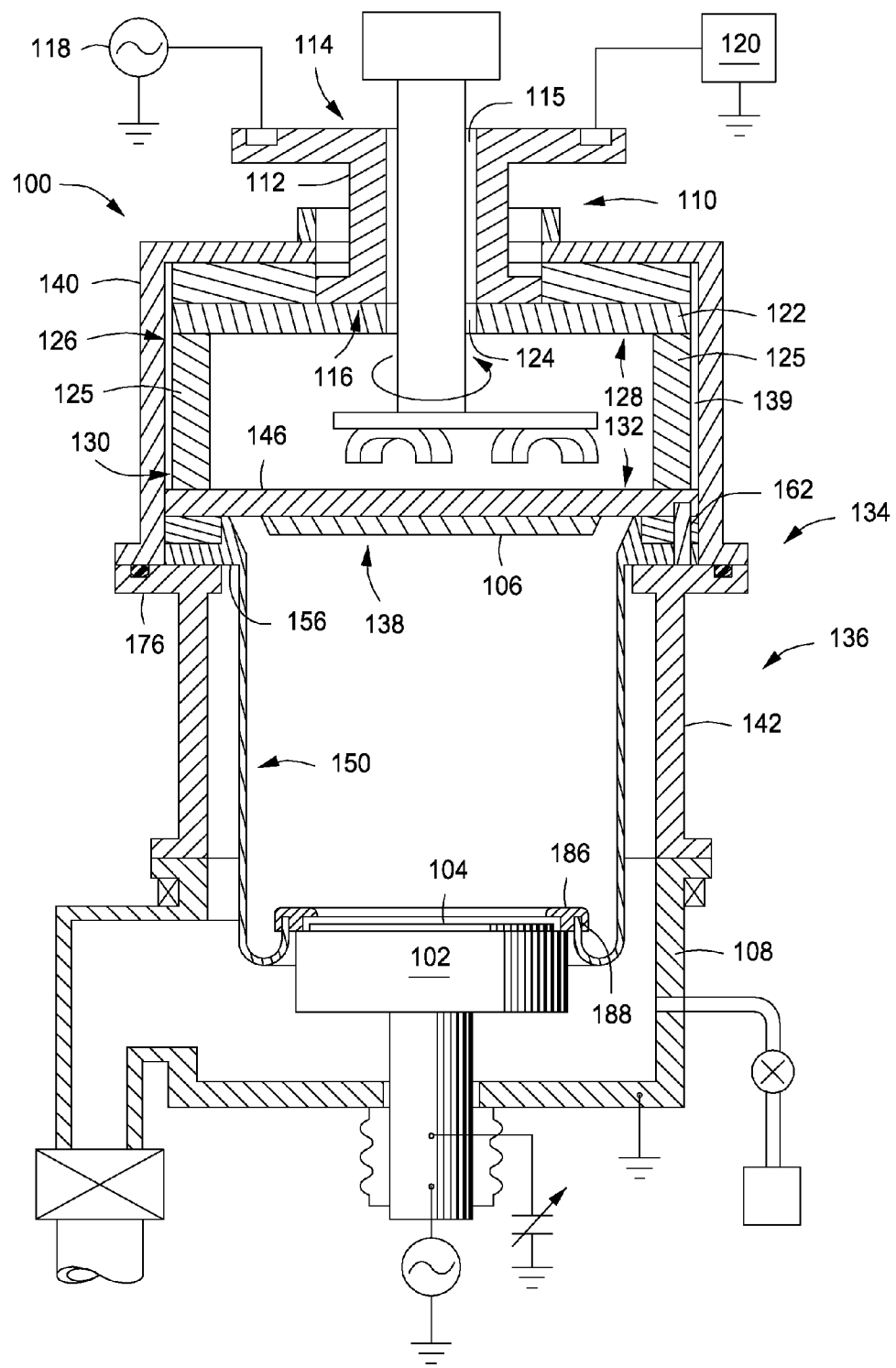
FIG. 1 depicts a schematic cross-sectional view of a process chamber in accordance with some embodiments of the present invention.

FIG. 1 depicts a schematic, cross-sectional view of a physical vapor deposition chamber, or process chamber 100, in accordance with some embodiments of the present invention. Examples of suitable PVD chambers include the ENDURA® PVD processing chamber, commercially available from Applied Materials, Inc., of Santa Clara, Calif. Other processing chambers from Applied Materials, Inc. or other manufactures may also benefit from the inventive apparatus disclosed herein.

In some embodiments, the process chamber 100 has a chamber lid 134 disposed atop a chamber body 136. In some embodiments, the chamber lid 134 can be rotatably opened from atop the chamber body 136 (e.g., rotated about a horizontal axis), for example, to install or replace a target or for performing maintenance on the process chamber 100. In some embodiments, the chamber lid 134 may be moveable about a horizontal axis of rotation at least from a closed position, as illustrated in FIG. 1, to an open position. The chamber lid 134 moves in an arc about the axis of rotation between the closed position and the open position.

In some embodiments, the chamber lid 134 includes a target assembly 138. In some embodiments, the target assembly 138 comprises a target material 106 and a target backing plate 146. The target material 106 comprises a material to be deposited on a substrate 104 during sputtering, such as a metal or metal oxide. In some embodiments, the backing plate 146 may comprise a conductive material, such as copper-zinc, copper-chrome, or the same material as the target, such that RF and DC power can be coupled to the target material 106 via the backing plate 146. Alternatively, the backing plate 146 may be non-conductive and may include conductive elements (not shown) such as electrical feedthroughs or the like.

The process chamber 100 further comprises a process shield 150, disposed within the chamber body 136 and below the target assembly 138. The process shield 150 prevents deposition of sputtered target material onto the sidewalls of the upper chamber adapter 142. As depicted in FIG. 1, the process shield 150 is supported within the chamber body 136 by a lip 156 resting atop a first support member 176. In some embodiments, the first support member may be a ledge of the upper chamber adapter 142. As described in detail below with respect to FIGS. 2-6B, the process shield comprises a plurality of pins 162 configured to shift the entire target assembly 138 into alignment atop the process shield 150 when the chamber lid is in the closed position depicted in FIG. 1.

Figure 2:
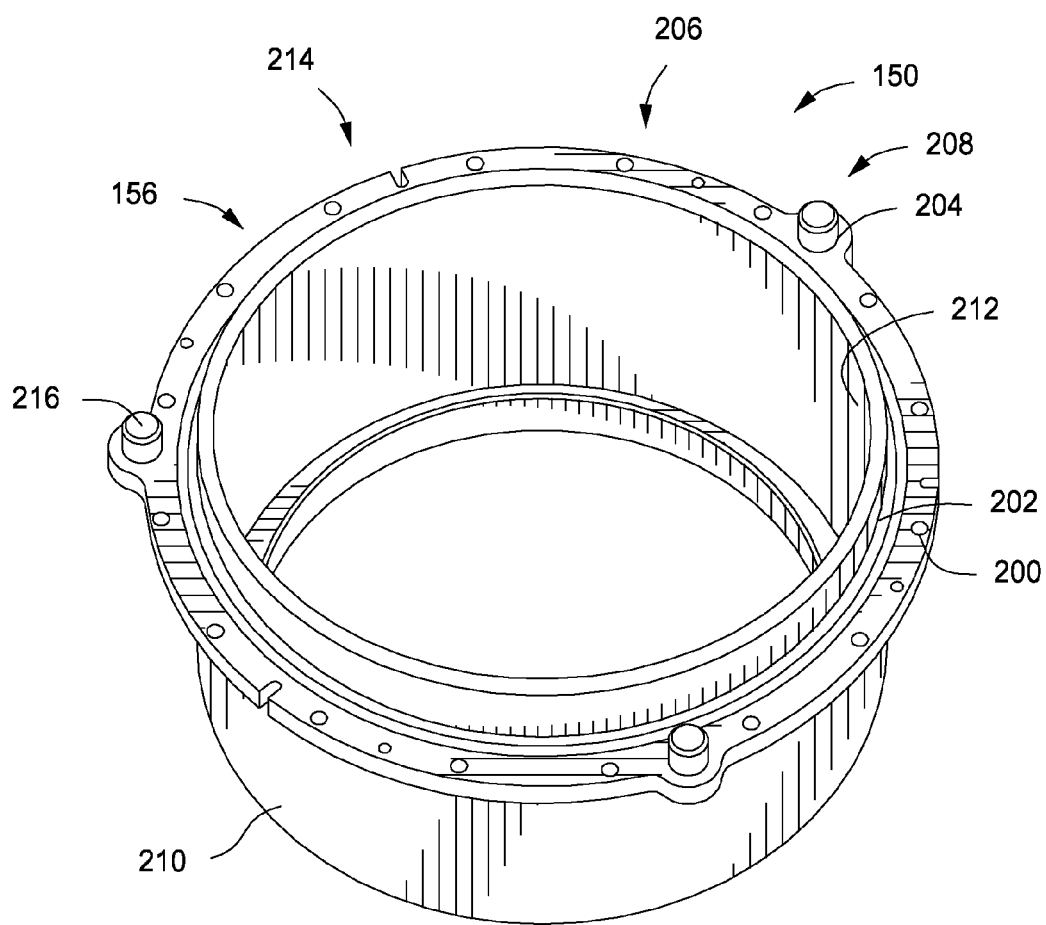
FIG. 2 depicts a schematic view of a process shield in accordance with some embodiments of the present invention.

FIG. 2 depicts a schematic view of the process shield 150 in accordance with some embodiments of the present invention. The process shield 150 comprises an elongated annular body 208 having an outer surface 210 and an inner surface 212 defining a central opening 214 of the elongated annular body 208. In some embodiments, the elongated annular body 208 is made of a dielectric material, such as ceramic. By providing a dielectric elongated annular body 208, arcing between the elongated annular body 208 and adjacent components that are RF hot may be avoided or minimized. The central opening 214 has a diameter that is greater than that of the target material 106 by a sufficient amount to prevent arcing as discussed above.

A lip 156 extends radially outward from the outer surface 210 of the elongated annular body 208 proximate a first end 206 of the elongated annular body 208 such that a first portion 202 of the elongated annular body 208 extends beyond the lip 156 toward the first end 206. In some embodiments, as depicted in FIG. 1, the lip 156 supports the process shield 150 atop the first support member 176 within the chamber body 136. In some embodiments, the process shield 150 is coupled to the first support member 176 by a plurality of fasteners, such as bolts, or the like, disposed through a plurality of fastener openings 200 disposed through the lip 156.

As described below with respect to FIG. 5B, the first portion 202 of the elongated annular body 208 is sloped away from the central opening 214 to advantageously prevent target material 106 from contacting the first portion 202 of the process shield 150 as the chamber lid 134 closes atop the chamber body 136.

Returning to FIG. 2, the lip 156 comprises a plurality of openings 204. A pin 216 is disposed in each of the openings 204. In some embodiments, the pins 216 are ceramic (e.g. aluminum oxide) to electrically isolate the RF hot target assembly 138 from the grounded process shield 150. The pins 216 are press fit into the openings 204 and cannot be removed from the openings. In some embodiments, the pins 216 and the shield may be thermally controlled for ease of assembly and improved fit and retention of the pins 216 in the openings 204 of the shield at room temperature. As discussed below with respect to FIG. 6B, as the chamber lid 134 rotates into the closed position; the pins 216 shift the entire target assembly 138 into alignment atop the process shield 150 such that the outer edge of the target material 106 is advantageously disposed a first distance 600 from an inner surface 212 of the elongated annular body 208 proximate the first end 206 in order to reduce arcing and enhance uniformity of the deposition process. The size of first distance 600 may vary depending upon process conditions, such as chamber pressure, RF frequencies used, and the like.

In some embodiments, as depicted in FIG. 2, the plurality of openings 204 are three openings 204 with each opening 204 having a pin 216 disposed therein although other numbers of openings 204 having a pin 216 disposed therein, may be provided in other embodiments. In some embodiments with three pins, the first pin and the second pin are closer to the axis of rotation of the chamber lid 134 than the third pin, thereby allowing them to engage the target assembly 138 prior to the third pin. The first pin and second pin engage the target assembly 138 at substantially the same time. This advantageously allows the two pins to share the weight of the chamber lid 134 as it descends atop the chamber body 136. This initial engagement of the target assembly 138 with the first pin and second pin begins to align the target assembly 138. The engagement of the third pin with the target assembly advantageously provides a final alignment of the target assembly 138 before the chamber lid 134 closes atop the chamber body 136. As discussed below with respect to FIG. 6B, the final alignment of the target assembly 138 aligns an outer edge of the target material 106 a first distance 600 from an inner surface 212 of the elongated annular body 208 proximate the first end 206. In some embodiments having three pins 216, a first pin and a second pin may be arranged such that the first and second pins are disposed in a line parallel to the horizontal axis of rotation of the lid and a third pin is disposed equidistantly from the first and second pins. For example, in some embodiments, a center of a first pin is located about 115 degrees from a center of a second pin and the center of the second pin is located about 115 degrees from a center of a third pin. Thus, center of the first pin and the center of the third pin are located about 130 degrees from each other. In some embodiments having three pins, the center of the pins can be located at greater or less than about 115 degrees from each other.

Figure 3:
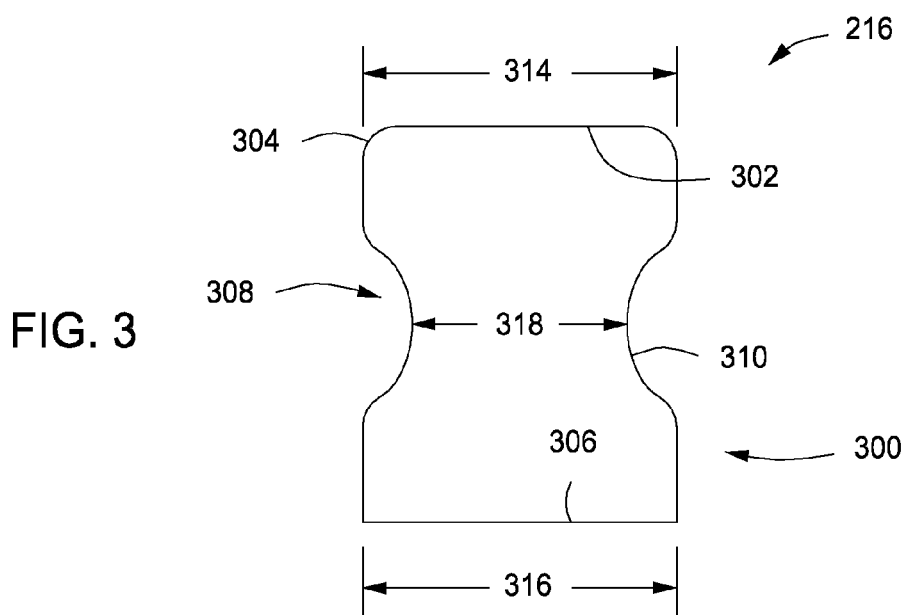
FIG. 3 depicts a schematic view of a pin and surrounding structure in accordance with some embodiments of the present invention.

As depicted in FIG. 3, a pin 216 comprises an elongated body 300 having a first surface 302 with a beveled or curved peripheral edge 304, wherein the first surface 302 has a first diameter 314, a second surface 306 opposing the first surface 302, wherein the second surface has a second diameter 316, and a sidewall 308, between the first surface 302 and the second surface 306, wherein the sidewall has a concave portion 310 having a third diameter 318. In some embodiments, the first diameter 314 and the second diameter 316 are substantially the same and the third diameter 318 is less than the first diameter and second diameter. As described below with respect to FIGS. 5A-5B, the shape of the pin 216 aids in the sliding of the target assembly 138 onto the pins 216 as the chamber lid 134 closes atop the chamber body 136.

Figure 4A:
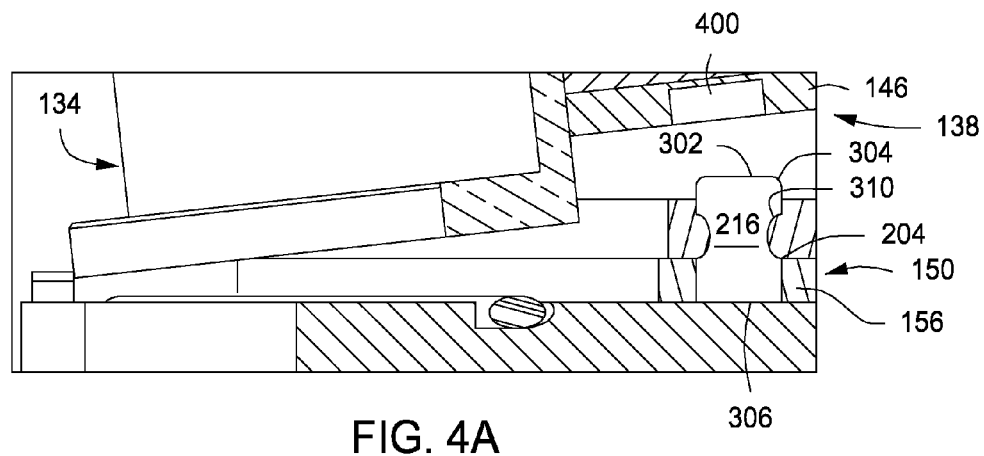
FIGS. 4A-4B depict a sectional view of a process shield and surrounding structure in a first position in accordance with some embodiments of the present invention.

FIG. 4A depicts the target assembly 138, the pin 216 and surrounding structure, prior to engagement between the target assembly 138 and the pin 216. The chamber lid 134 is in a partially closed position. The pin 216 is disposed within an opening 204 in the lip 156 of the process shield 150. The pin 216 may extend in a substantially normal direction from a bottom of the opening 204 in the lip 156. As described above, the pin 216 may be press fit or otherwise secured into the opening 204 in the lip 156.

Figure 4B:
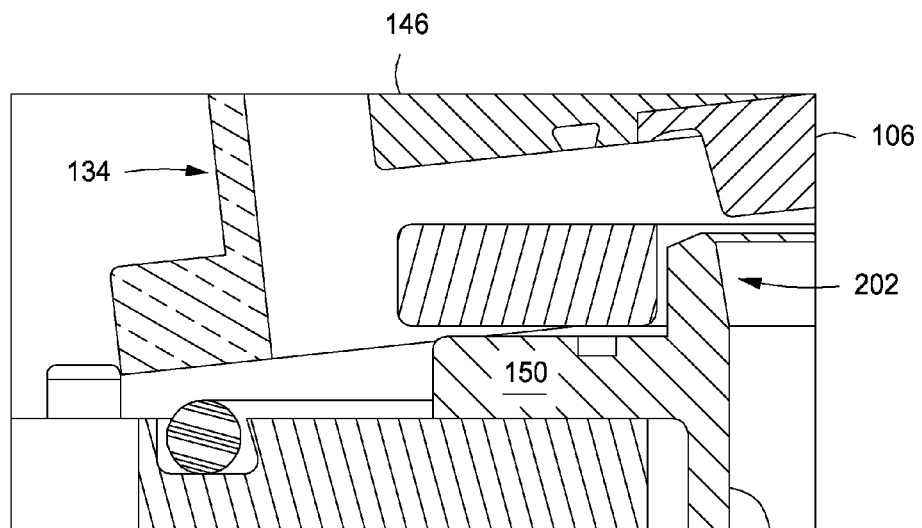

In some embodiments, the target assembly 138 may comprise alignment features to interface with, or fit into, the pins 216 in the process shield 150. In some embodiments, as depicted in FIG. 4A, the backing plate 146 of the target assembly 138 may comprise a slot 400 configured to engage the pin 216. The number of slots 400 in the backing plate 146 is equal to the number of pins 216 in the process shield 150. The placement of the slots 400 in the backing plate 146 mirrors the placement of the pins 216 in the process shield 150 to allow the pins 216 to engage the slots 400 and align the target assembly 138 with the process shield 150. For example, in embodiments having three pins 216 with a center of a first pin located about 115 degrees from a center of a second pin and the center of the second pin located about 115 degrees from a center of a third pin; the backing plate 146 will have three slots 400 with a center of a first slot located about 115 degrees from a center of a second slot and the center of the second slot located about 115 degrees from a center of a third slot. As depicted in FIG. 4B, prior to engagement between the target assembly 138 and the pin 216, the target material 106 is disposed above the process shield 150.

In some embodiments having three slots and three pins, the center to center location of the slots and the center to center location of the pins as discussed above can be greater than or less than 115 degrees from each other. Providing slots and pins having centers at >115° leads to a more vertical component (i.e., the pins and slots engage while the lid is more vertical), and hence more front to back misalignment. Providing slots and pins having centers at <115° leads to a less vertical component (i.e., the pins and slots engage when the lid is less vertical), and hence less front to back misalignment. However, a greater amount of force would be needed to overcome o-ring friction. Although three slots and pins are shown in the drawings, more pins and slots (i.e., greater than 3) can also be used to provide greater alignment.

Figure 5A:
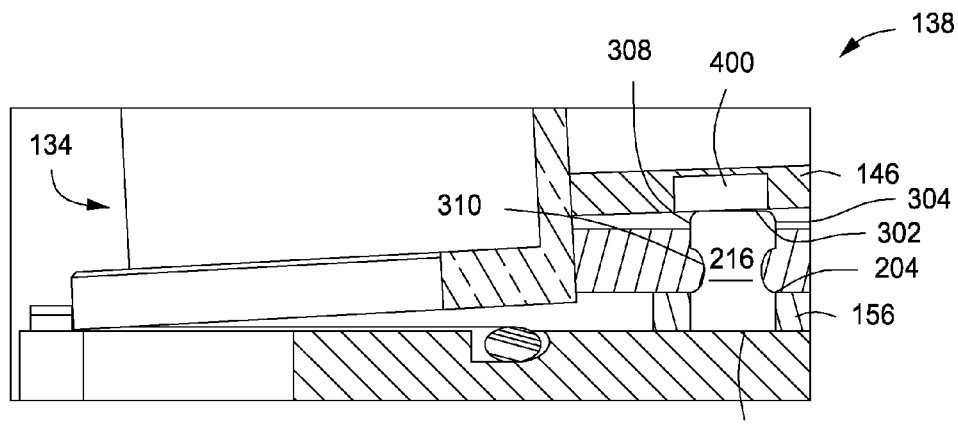
FIGS. 5A-5B depict a sectional view of a process shield and surrounding structure in a second position in accordance with some embodiments of the present invention.
Figure 5B:
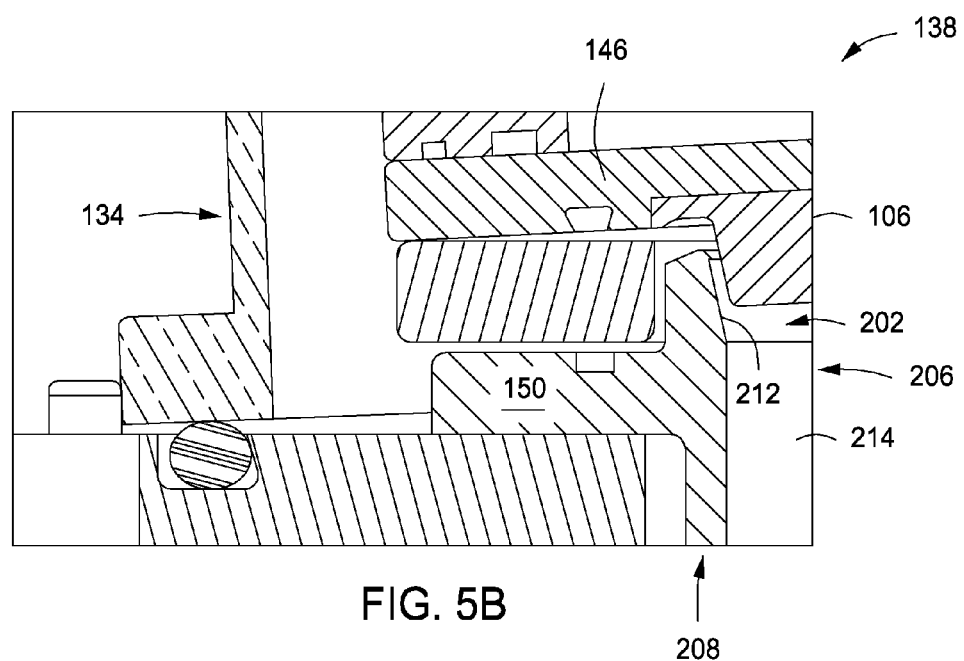

FIG. 5A depicts the target assembly 138, the pin 216 and surrounding structure, as the target assembly 138 makes contact with one of the pins 216 closest to the axis of rotation of the chamber lid 134. In some embodiments, as depicted in FIG. 5A, the beveled peripheral edge 304 of the pin 216 contacts the outer edge of slot 400. The beveled peripheral edge 304 advantageously allows the slot 400 to slide down the beveled peripheral edge 304 and over a portion of the side wall 308 extending above the top surface of the lip 156. As depicted in FIG. 5B, as the pin 216 contacts the slot 400, the target material 106 enters the central opening 214 of the process shield 150 proximate the first end 206. As depicted in FIG. 5B, the inner surface 212 of the first portion 202 of the elongated annular body 208 is sloped away from the central opening 214 preventing the target material 106 from contacting, and scraping off onto, the process shield 150 as the target assembly 138 rotates onto the process shield 150. In some embodiments, the inner surface 212 of the first portion 202 has a slope of about 10 to about 15 degrees away from the central opening 214.

Figure 6A:
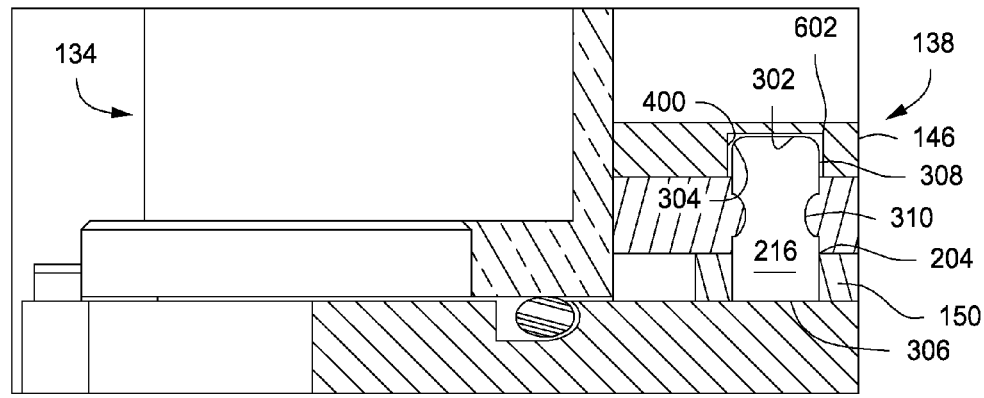
FIGS. 6A-6B depict a sectional view of a process shield and surrounding structure in a third position in accordance with some embodiments of the present invention.
Figure 6B:
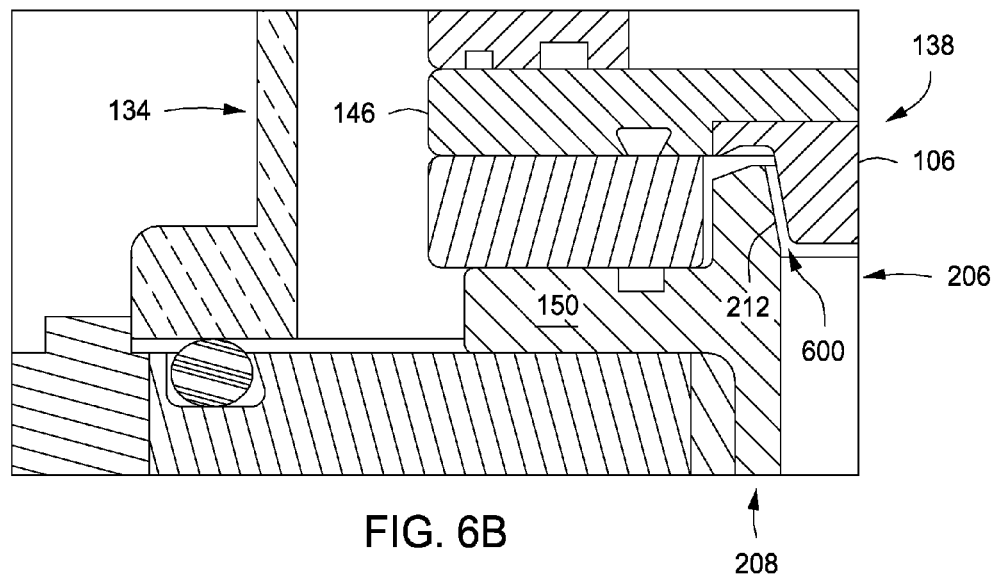

FIG. 6A depicts the target assembly 138, the pin 216 and surrounding structure as the target assembly 138 aligns with the process shield 150. In some embodiments, as depicted in FIG. 6A, a first portion of the pin 216 comprising the first surface 302, the beveled peripheral edge 304 and a first portion of the sidewall 308 is engaged within the slot 400. The first surface 302 of the pin 216 does not contact the upper surface 602 of the slot 400. As depicted in FIG. 6B, once the pin 216 is fully engaged with the slot 400 in the target assembly 138, the target material 106 is advantageously aligned a first distance 600 from an inner surface 212 of the elongated annular body 208 proximate the first end 206 in order to prevent or minimize arcing between the target material 106 and process shield 150 and enhance uniformity of the deposition process. In addition, once the pin 216 is fully engaged with the slot 400 in the target assembly 138, only the target material 106 and not the backing plate 146 is within the first distance 600, also referred to as the dark space region, between the outer edge of the target material 106 and the inner surface 212 of the elongated annular body 208 proximate the first end 206. Not having the backing plate 146 within the dark space region advantageously avoids sputtering of the backing plate material.

Returning to FIG. 1, in some embodiments, the feed structure 110 couples RF and, optionally, DC energy to the target assembly 138. Although a particular feed structure 110 is described below, other feed structures having other configurations may also be utilized. In some embodiments, the feed structure 110 may include a body 112 having a first end 114 that can be coupled to an RF power source 118 and, optionally, a DC power source 120, which can be respectively utilized to provide RF and DC energy to the target assembly 138. A second end 116 of the feed structure 110, opposite the first end 114, is coupled to the chamber lid 134. In some embodiments, the body 112 further includes a central opening 115 disposed through the body 112 from the first end 114 to the second end 116. The feed structure 110 may be fabricated from suitable conductive materials to conduct the RF and DC energy from the RF power source 118 and the DC power source 120.

In some embodiments, the chamber lid 134 may further include a source distribution plate 122 to distribute the energy applied via the feed structure 110 to the peripheral edge of the target assembly 138 via a conductive member 125. As such, in some embodiments, the second end 116 of the body 112 may be coupled to the source distribution plate 122. The source distribution plate includes a hole 124 disposed through the source distribution plate 122 and aligned with the central opening 115 of the body 112. The source distribution plate 122 may be fabricated from suitable conductive materials to conduct the RF and DC energy from the feed structure 110.

The conductive member 125 may be a tubular member having a first end 126 coupled to a target-facing surface 128 of the source distribution plate 122 proximate the peripheral edge of the source distribution plate 122. The conductive member 125 further includes a second end 130 coupled to a source distribution plate-facing surface 132 of the target material 106 (or to the backing plate 146 of the target material 106) proximate the peripheral edge of the target material 106.

A ground shield 140 may be provided to cover the outside surfaces of the chamber lid 134. The ground shield 140 may be coupled to ground, for example, via the ground connection of the chamber body 136. In some embodiments, the ground shield 140 may have a central opening to allow the feed structure 110 to pass through the ground shield 140 to be coupled to the source distribution plate 122. The ground shield 140 may comprise any suitable conductive material, such as aluminum, copper, or the like. An insulative gap 139 is provided between the ground shield 140 and the outer surfaces of the source distribution plate 122, the conductive member 125, and the target material 106 (and/or backing plate 146) to prevent the RF and DC energy from being routed directly to ground. The insulative gap may be filled with air or some other suitable dielectric material, such as a ceramic, a plastic, or the like.

The chamber body 136 contains a substrate support pedestal 102 for receiving a substrate 104 thereon. The substrate support pedestal 102 may be located within a grounded enclosure wall 108, which may be a chamber wall (as shown) or a grounded shield. The ground shield 140 may cover at least some portions of the process chamber 100 above the target material 106.

The process shield 150 extends along the walls of the upper chamber adapter 142 and the enclosure wall 108 downwardly to below a top surface of the substrate support pedestal 102 and returns upwardly until reaching a top surface of the substrate support pedestal 102. A cover ring 186 rests on the top of the upwardly extending inner portion 188 of the process shield 150 when the substrate support pedestal 102 is in its lower, loading position but rests on the outer periphery of the substrate support pedestal 102 when it is in its upper, deposition position to protect the substrate support pedestal 102 from sputter deposition.

While the foregoing is directed to embodiments of the present invention, other and further embodiments of the invention may be devised without departing from the basic scope thereof.

The invention claimed is:

1. A process shield for use in a substrate processing chamber having a chamber lid comprising a target coupled to the chamber lid, the process shield comprising:
    an elongated annular body having an outer surface and an inner surface defining a central opening of the body;
    a lip extending radially outward from the outer surface of the body proximate a first end of the body such that a first portion of the body extends beyond the lip toward the first end;
    a plurality of openings in the lip; and
    a pin disposed in each of at least three of the plurality of openings and protruding from the lip to align the target atop the process shield as the chamber lid is placed atop the process shield, wherein a center of a first pin is located at a first angle of about 115 degrees from a center of a second pin, the center of the second pin is located at a second angle of about 115 degrees from the center of a third pin, and the center of the first pin is located at a third angle of about 130 degrees from the center of the third pin, and wherein the third angle is greater than each of the first and second angles.

2. The process shield of claim 1, wherein the inner surface of the body proximate the first end is disposed about the target and spaced apart from the target by a first distance.

3. The process shield of claim 2, wherein the inner surface of the body proximate the first end is configured to avoid contacting the target as the chamber lid rotates in an arc onto the process shield.

4. The process shield of claim 1, wherein each pin is not removable from each of the plurality of openings.

5. The process shield of claim 1, wherein the plurality of openings are three openings.

6. The process shield of claim 1, wherein the first pin and the second pin engage the target prior to the third pin.

7. The process shield of claim 6, wherein the first pin, the second pin and the third pin engage the target to align an outer edge of the target a first distance from an inner surface of the body.

8. The process shield of claim 1, wherein each pin is ceramic.

9. A process shield for use in a substrate processing chamber having a chamber lid comprising a target coupled to the chamber lid, the process shield comprising:
    an elongated annular body having an outer surface and an inner surface defining a central opening of the body;
    a lip extending radially outward from the outer surface of the body proximate a first end of the body such that a first portion of the body extends beyond the lip toward the first end;
    three openings in the lip; and
    a pin disposed in each of the three openings and protruding from the lip to align the target atop the process shield as the chamber lid is placed atop the process shield, wherein a center of a first pin is located at a first angle of about 115 degrees from a center of a second pin, the center of the second pin is located at a second angle of about 115 degrees from the center of a third pin, and the center of the first pin is located at a third angle of about 130 degrees from the center of the third pin, and wherein the third angle is greater than each of the first and second angles and, wherein each pin comprises:

an elongated body having a first surface with a first diameter and a beveled peripheral edge;
a second surface opposing the first surface and having a second diameter; and
a sidewall disposed between the first surface and the second surface, wherein the sidewall has a concave portion having a third diameter, and wherein each pin engages the target to align an outer edge of the target a first distance from an inner surface of the body.

10. A substrate processing chamber, comprising:
a chamber body;
a chamber lid disposed atop the chamber body, wherein the chamber lid comprises an axis of rotation configured to rotate the chamber lid onto the chamber body;
a target assembly disposed within the chamber lid, wherein the target assembly comprises a target material coupled to a backing plate; and
a process shield disposed within the chamber body and below the target assembly, the process shield comprising:
an elongated annular body having an outer surface and an inner surface defining a central opening of the body;
a lip extending radially outward from the outer surface of the body proximate a first end of the body such that a first portion of the body extends beyond the lip toward the first end;
a plurality of openings in the lip; and
a pin disposed in each of at least three of the plurality of openings and protruding from the lip to align the target assembly atop the process shield as the chamber lid is placed atop the process shield, wherein a center of a first pin is located at a first angle of about 115 degrees from a center of a second pin, the center of the second pin is located at a second angle of about 115 degrees from the center of a third pin, and the center of the first pin is located at a third angle of about 130 degrees from the center of the third pin, and wherein the third angle is greater than each of the first and second angles and, wherein the pin comprises an elongated body having a first surface with a beveled peripheral edge, wherein the first surface has a first diameter, a second surface opposing the first surface, wherein the second surface has a second diameter, and a sidewall, between the first surface and the second surface, wherein the sidewall has a concave portion having a third diameter.

11. The substrate processing chamber of claim 10, wherein the lip is supported by a first support member of the substrate processing chamber to support the process shield within the substrate processing chamber.

12. The substrate processing chamber of claim 10, wherein the axis of rotation is configured to rotate the chamber lid in an arc onto the chamber body.

13. The substrate processing chamber of claim 10, wherein the inner surface of the body proximate the first end is disposed about the target material and spaced apart from the target material by a first distance.

14. The substrate processing chamber of claim 13, wherein the inner surface of the body proximate the first end avoids contact with the target material as the target assembly rotates onto the process shield.

15. The substrate processing chamber of claim 10, wherein the plurality of openings are three openings with each opening having a pin disposed therein.

16. The substrate processing chamber of claim 10, wherein the first pin and the second pin are closer to the axis of rotation than the third pin, and wherein the first pin and the second pin engage the target assembly prior to the third pin.

17. The substrate processing chamber of claim 16, wherein the first pin, the second pin and the third pin engage the target assembly to align an outer edge of the target material a first distance from an inner surface of the body proximate the first end.

18. The process shield of claim 1, wherein the pin comprises an elongated body having a first surface with a beveled peripheral edge, wherein the first surface has a first diameter, a second surface opposing the first surface, wherein the second surface has a second diameter, and a sidewall, between the first surface and the second surface, wherein the sidewall has a concave portion having a third diameter.

* * * * *